April 26, 1966 W. R. WIRTZ 3,247,574

RADIO FREQUENCY SHIELDING CABINETS

Filed Aug. 1, 1962

INVENTOR
WILBUR R. WIRTZ
BY
[signature]

United States Patent Office 3,247,574

Patented Apr. 26, 1966

3,247,574

RADIO FREQUENCY SHIELDING CABINETS

Wilbur R. Wirtz, Los Altos, Calif., assignor to International Telephone and Telegraph Corporation, New York, N.Y., a corporation of Maryland Filed Aug. 1, 1962, Ser. No. 214,100
14 Claims. (Cl. 29—155.5)

Figures 1, 2:
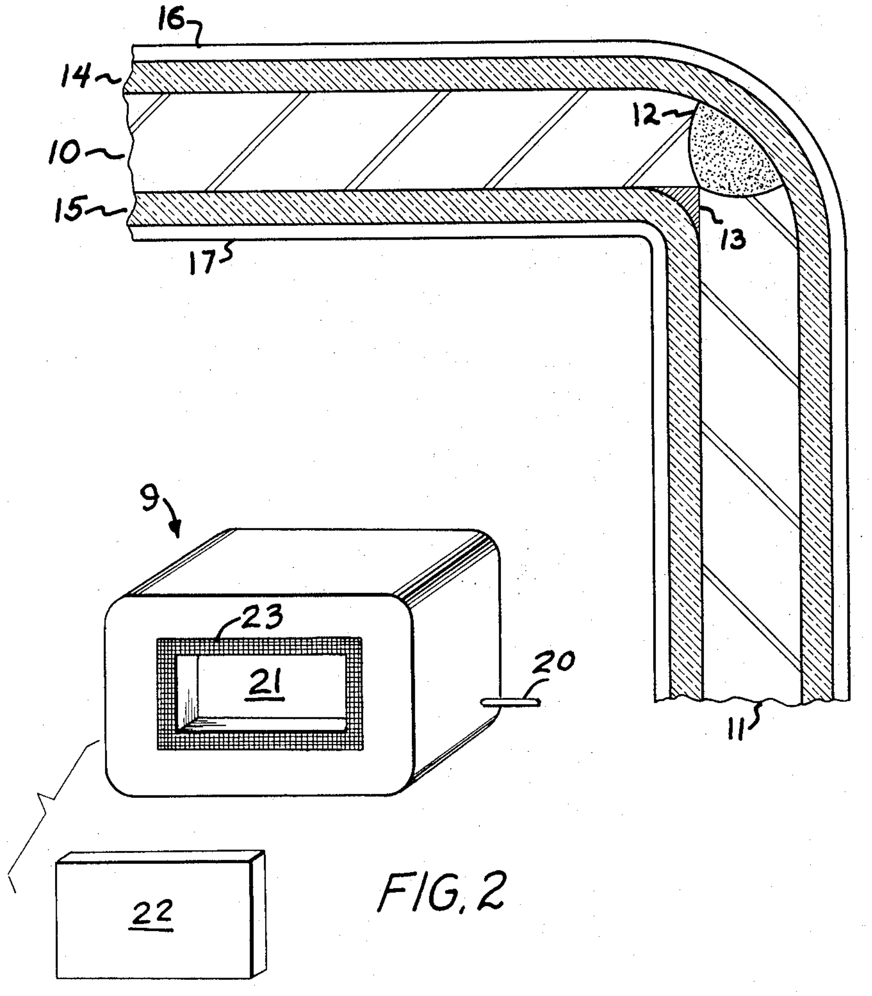

This invention relates to cabinet construction methods and more particularly to construction for shielding electrical circuits against radio frequency interferences.

The phenomena of radiation, radio frequency interference, and shielding are well known. Briefly, radiation is the emission of energy in the form of an electromagnetic wave set free in space by radio frequency currents flowing in a conductor. Radio frequency interference occurs when a receiving circuit picks up any unwanted radiation. A shielding is a grounded metallic shield surrounding instruments or other apparatus and interposed between such instruments or apparatus and extraneous sources of radiation.

Conventionally, radio frequency electrical equipment may be housed in steel cabinets. However, steel is not an efficient electrical conductor and, thus, can not always provide adequate shielding for the equipment housed therein. To increase the conductive efficiency and, therefore, the shielding properties of the cabinets, it is common practice to manufacture equipment cabinets from copper clad steel. But, this copper clad material can not be welded. Therefore, cabinet panels are usually joined by clips or clamps designed to maintain close fitting joints. This is not completely satisfactory, however, because the joints do not fit perfectly and RF leakage occurs. Thus, convention requires cabinet redundancy. That is, cabinets have a double walled sandwich of two sheets of copper clad steel separated by a dielectric such as air. The result is a heavy, inefficient, bulky cabinet still having mechanical joints and, therefore, RF leakage.

Accordingly, an object of the invention is to provide new and improved electrical cabinets having highly efficient RF shielding properties. Here an object is to provide cabinets having the strength of steel and the shielding properties of a continuous, unjointed, copper shell. In this connection, an object is to reduce the cabinet bulk and weight to a minimum without sacrificing either strength or shielding efficiency. Quite the contrary, an object is to improve both the strength and shielding efficiency. Thus, an advantage of the invention is that the most exacting cabinet specifications may be met.

In accordance with one aspect of this invention, an equipment cabinet comprises a base structure manufactured from sheet steel. All joints are welded, filled, and ground smooth. Then, the entire cabinet is plated to provide a continuous, unbroken copper shell. Next, suitable abrasion and corrosion resistant material is added to protect the copper plating. Finally, provisions are made for grounding the copper shell when the equipment cabinet is installed for operation.

The above mentioned and other features of this invention and the manner of obtaining them will become more apparent, and the invention itself will be best understood by reference to the following description of an embodiment of the invention taken in conjunction with the accompanying single sheet of drawing in which:

FIG. 1 shows a cross-sectional view of the corner of a cabinet constructed according to this invention to illustrate how a continuous, unjointed shielding is produced; and FIG. 2 shows a cabinet constructed in the manner taught herein.

The methods described and the material thickness and composition involved are directed to a cabinet meeting the most exacting military and commercial specifications wherein appearance, physical and chemical protection, strength, rigidity, and acceptable levels of radiation are primary prerequisites. It should be apparent to those skilled in the art that variations can be made to meet any specific needs. For example, twenty-four gauge, cold rolled, mild steel provides adequate RF shielding at low frequencies, but heavier gauge steel may be selected when added strength is required. Similarly, fabrication tools and techniques may influence the selection of materials. Quite obviously, other examples could be cited to show that the appended claims should be construed to cover a wide range of equivalents.

To manufacture electrical instrument and other apparatus cabinets 9 according to the teachings of this invention, sheet steel is first fabricated into panels of desired size and shape or contour. Then, the panels are welded together through the use of conventional techniques with care being taken to avoid unfilled joints. Thereafter, all clips, brackets, appurtenances and the like are spot welded into place. Then the welded seams are ground smooth and examined for flaws. For example, the drawing shows two panels of sheet steel 10, 11 joined by weld material 12 which has been ground to form a quarter-round outside corner.

After the welded seams are found flawless, the cabinet is cleaned by sand blasting followed by a pickling process, as by immersing in an acid bath, for example. The acid is then neutralized to provide a clean, dry surface free of any destructive or contaminating agents. After the cabinet 9 is clean and dry, the entire structure is flash coated with a solderable plating, which may be copper of approximately 0.0002 inch thickness, for example.

To improve the general configuration and appearance of the cabinet and to further seal the welded seams, solder is flowed into surface irregularities and porosities. Preferably the solder will have ingredients proportioned in the order of 50% tin and 50% lead. As shown at 13, the solder fills the inside cabinet corner to provide a cove molding. The solder may of course appear elsewhere on the cabinet, as required. This solder completes a smooth overall surface free of any openings which might permit the leakage of RF interferences into the cabinet. Thereafter, the entire cabinet is cleaned inside and outside, preferably by hydro-honing.

To provide the RF shielding, the entire cabinet 9 is next plated inside and outside with a layer of electrically conductive material, such as pure copper approximately 0.007 inch thick, as shown at 14, 15. This makes an effective RF shielding 0.014 inch thick.

A protective coating 16, 17 is added inside and outside to protect the copper from oxidation, corrosion, contamination, chemical attack, abrasions, scratches or other chemical or physical damages. In one embodiment this protective coating included a cadmium plating 0.0005 inch thick. When this protective coating or cadmium plating is added, a small portion of the copper plating is masked or otherwise left unplated to retain a point of pure copper to which a grounding wire 20 is attached. Finally the protective coating is completed by a coat of paint wherever required or desired. When the paint is applied, all areas of gasket contact and the grounding point are also masked or otherwise left unpainted.

Finally, all ports 21 in the cabinet are closed by doors 22 or other covers which, when shut, close upon metallic gaskets 23 that make contact with the unpainted areas which were masked when the cabinet was painted. Preferably these gaskets are knitted from monel metal wire.

Upon reflection it will be apparent that cabinets made by the above described method provides a continuous, unbroken, double shell sandwich of copper shielding separated by a steel center. The steel gives good low frequency shielding, and the copper gives good high frequency shielding.

The advantages of the cabinet construction described herein are numerous. First, the cabinets provide the desirable, unjointed, double copper shell. Second, the unitary welded construction gives great mechanical strength as compared with the old double wall shell separated by air. Third, the compact, strong cabinet are ideally suited for use in connection with aerospace equipment. Of course, still other advantages will readily occur to those skilled in the art.

While the principles of the invention have been described above in connection with specific apparatus and applications, it is to be understood that this description is made only by way of example and not as a limitation on the scope of the invention.

The claimed invention is:

1. The method of cabinet construction comprising the steps of forming metal panels of desired size and shape, welding said panels together to provide a completed enclosure having at least one opening therein, plating said enclosure with a layer of conductive material to provide a continuous and unbroken shell of shielding material over the entire surface of at least one side of said enclosure, and sealing all openings by covers which close on metallic gaskets, said covers also being plated with conductive material to complete said shell of shielding material.

2. The method of claim 1 wherein said enclosure is plated inside and outside with said conductive material to provide a double shell sandwich of shielding material.

3. The method of claim 2 and the step of soldering the seams of said cabinet between the steps of welding and plating, said solder filling surface irregularities and porosities.

4. The method of constructing RF shielded cabinets comprising the steps of fabricating panels of desired shape and contour, welding together the joints between said panels to provide an enclosure which is a unitary structure having completely filled joints, grinding the welded joints to provide smooth unbroken surfaces, flash plating the surfaces of said welded structure to provide for the easy adherence of solder, filling surface irregularities and porosities with solder to provide a smooth overall surface free of any openings for RF leakage, and plating the entire said structure with a continuous and unbroken layer of electrically conductive material.

5. The method of claim 4 and the step of adding a protective coating to protect the conductive material.

6. The method of claim 5 wherein said protective coating is applied to all of said plating except a grounding point and areas of contact between said structure and covers for openings in said structure, and the step of applying metallic gaskets to the unprotected areas around said openings.

7. The method of cabinet construction comprising the steps of fabricating sheet metal into a desired contour, there being at least one joint in said metal, filling all joints of said fabricated sheet metal with molten metal, smoothing said molten metal to provide an effectively smooth and unbroken cabinet shell, plating said shell with electrically conductive material, and adding a protective coating to protect said plating against chemical and physical damage.

8. The method of claim 7 wherein said smoothing step comprises the steps of grinding said joints after being filled with said molten metal, sand blasting said structure, pickling said sand blasted structure by an acid bath, and neutralizing said acid after said pickling step.

9. The method of claim 8 and the step of hydro-honing said cabinet between the steps of smoothing and adding of said protective coating.

10. The method of claim 9 wherein said cabinet shell has a port closed by a door and the step of adding knitted metal gaskets to seal all spaces between said port in said structure and the door closing said port.

11. The method of claim 7 and the step of hydro-honing said cabinet between the steps of plating and adding said protective coating.

12. The method of claim 11 wherein said cabinet shell has a port closed by a door and the step of adding knitted metal gaskets to seal all spaces between said port in said structure and the door closing said port.

13. The method of claim 7 wherein said plating step comprises the steps of flash plating said structure, filling all irregularities and porosities with solder, and then plating the entire structure with substantially pure copper.

14. The method of claim 13 wherein the step of plating includes the step of hydro-honing interposed between said steps of soldering and plating and the adding of said protective coating comprises the step of cadmium plating said structure.

References Cited by the Examiner

UNITED STATES PATENTS

| | | | |
|---|---|---|---|
| 2,978,531 | 4/1961 | Appleman | 174—35.4 |

FOREIGN PATENTS

| | | |
|---|---|---|
| 768,996 | 2/1957 | Great Britain. |

OTHER REFERENCES

"Ace Shielded Enclosures," (Publication of The Ace Engineering and Machine Co., 3644 N. Lawrence St., Philadelphia 40, Pa., March 1955.

"Suppressing Radio Interference With Metex Electronic Weatherstrip and RF Gaskets" (Publication of Metal Textile Corporation, Roselle, New Jersey), May 1, 1955.

JOHN F. CAMPBELL, *Primary Examiner.*

C. I. SHERMAN, *Assistant Examiner.*